United States Patent [19]

Barnes et al.

[11] Patent Number: 5,189,446
[45] Date of Patent: Feb. 23, 1993

[54] PLASMA WAFER PROCESSING TOOL HAVING CLOSED ELECTRON CYCLOTRON RESONANCE

[75] Inventors: Michael S. Barnes, Mahopac; John C. Forster; John H. Keller, both of Poughkeepsie, all of N.Y.

[73] Assignee: International Business Machines Corporation, Armonk, N.Y.

[21] Appl. No.: 702,654

[22] Filed: May 17, 1991

[51] Int. Cl.$^5$ .............................................. H05H 1/18
[52] U.S. Cl. ......................... 315/111.41; 315/111.21; 313/231.31
[58] Field of Search .................. 315/111.21, 111.41, 315/111.71, 111.81; 313/231.31

[56] References Cited

U.S. PATENT DOCUMENTS

| | | | |
|---|---|---|---|
| 4,559,477 | 12/1985 | Leung et al. | 315/111.81 |
| 4,631,438 | 12/1986 | Jacquot | 315/111.71 X |
| 4,713,585 | 12/1987 | Ohno et al. | 315/111.81 |
| 4,716,491 | 12/1987 | Ohno et al. | 361/230 |
| 4,727,293 | 2/1988 | Asmussen et al. | 315/111.41 |
| 4,745,337 | 5/1988 | Pichot et al. | 315/111.41 |
| 4,767,931 | 8/1988 | Sato et al. | 250/423 R |
| 4,780,642 | 10/1988 | Jacquot | 315/111.81 X |
| 4,826,585 | 5/1989 | Davis | 204/298 |
| 4,915,979 | 4/1990 | Ishida et al. | 427/39 |
| 4,987,346 | 1/1991 | Katzschner et al. | 315/111.21 X |
| 5,022,977 | 6/1991 | Matsuoka et al. | 315/111.41 X |
| 5,081,398 | 1/1992 | Asmussen et al. | 315/111.21 X |

OTHER PUBLICATIONS

Paper, "Si Etching with Low Ion Energy in Low Pressure ECR Plasma Generated by Longitudinal and Multipole Magnetic Fields", by H. Shindo et al., Proceedings of Symposium on Dry Process, Oct. 30-31, 1989, Tokyo, pp. 21-26.
Book, "Introduction to Plasma Physics", by Francis F. Chen, Plenum Press, 1974, pp. 299-300.
"Cold and Low Energy Ion Etching with ECR Plasma Using a Hybrid Magnetic Field", by N. Fujiwara et al., Proceedings of Symposium on Dry Process, pp. 15-17, Oct. 30-31, 1989, Tokyo.
"Cold and Low-Energy Ion Etching (COLLIE)", by N. Fujiwara et al., Japanese Journal Applied Physics, vol. 28, 1989, pp. 2147-2150.

Primary Examiner—Eugene R. LaRoche
Assistant Examiner—Do Hyun Yoo
Attorney, Agent, or Firm—Graham S. Jones, II

[57] ABSTRACT

A cylindrical plasma reaction chamber is equipped with a pair of axially separated solenoid coils and a multipole magnet structure extending between the coil pair. An axially-directed magnetic field and a transverse cusp field are respectively provided by the coils and the magnet. A working gas is contained within the chamber and is excited by applied microwave energy. The strengths of the two magnetic fields and the microwave frequency value are selected to produce a substantially closed electron cyclotron resonance (ECR) zone of proper size. This ECR zone is located axially between the solenoid fields. Baffling is used to separate the closed plasma ECR zone from the workpiece region of the chamber. A semiconductor wafer is positioned within the workpiece region to intercept most plasma particles which follow the axially directed magnetic lines passing through the ECR zone. Few of the particles from the closed ECR zone travel to destinations other than the wafer.

11 Claims, 4 Drawing Sheets

PLASMA WAFER PROCESSING TOOL HAVING CLOSED ELECTRON CYCLOTRON RESONANCE

BACKGROUND OF THE INVENTION

The present invention generally relates to semiconductor device fabrication tools and, more particularly, to such tools utilizing an electron cyclotron resonance plasma for processing device surfaces, e.g., as in plasma etching or thin film deposition applications.

In a conventional electron cyclotron resonance (ECR) plasma reactor, microwave power is used to produce the plasma in the presence of a magnetic field. The magnetic field strength and the microwave frequency are selected to bring about electron cyclotron resonance inside the plasma. This condition results in efficient microwave energy excitation of the plasma electrons.

Existing ECR reactors used in plasma processing lose a significant part of the plasma generated in the resonance zone to the reactor walls or to other destinations outside the desired target (device workpiece). Many of the magnetic field lines that pass through the resonance zone also intersect non-target areas, such as the reactor chamber walls. Since the charged plasma particles follow the magnetic field lines to a large extent, there is a resultant significant power loss to the walls, as well as the possibility of contamination due to the plasma bombardment of the walls. In one instance, an axial magnetic field is provided by a solenoid coil positioned around the plasma generating chamber as described in U.S. Pat. No. 4,915,979, issued Apr. 10, 1990 to Tomoaki Ishida et al. In another case, multipole magnets surround the chamber to provide a cusp-shaped magnetic field as taught in U.S. Pat. No. 4,745,337, issued May 17, 1988 to Michel Pichot et al. In a third reference, an axial magnetic field is used in combination with a cusp-shaped magnetic field as described in the paper "Si Etching With Low Ion Energy In Low Pressure ECR Plasma Generated By Longitudinal and Multipole Magnetic Fields" by H. Shindo et al, Proceedings of Symposium on Dry Process, Oct. 30–31, 1989, Tokyo, pg. 21–26, sponsored by the Institute of Electrical Engineers of Japan.

Each of the above described magnetic field configurations, as employed in the prior art, generate an ECR zone which is contiguous to the chamber walls of the plasma generator. Inasmuch as the charged plasma particles tend to follow the magnetic field lines that pass through the plasma, many of the plasma particles are either directly intercepted by the contiguous chamber walls or reach the walls downstream of the ECR zone or otherwise fail to reach the intended target or workpiece within the plasma processing tool. The result is a costly reduction in tool efficiency and a possible contamination of the work piece due to ionic bombardment of unintended targets.

Referring to a prior art plasma generator exemplified by FIG. 1, a pair of solenoid coils 41 and 42 surround a cylindrical plasma reaction chamber 43. Coils 41 and 42 are energized to provide a magnetic field directed axially along chamber 43 which interacts with a source of microwave excitation (not shown) to excite gas 44 to produce a plasma within ECR zone 48 in a manner well understood in the art as described in the U.S. Pat. No. 4,915,979. Magnetic field lines 46 guide the plasma particles generally toward wafer target 47, although many of the plasma particles are intercepted by the walls of chamber 43 contiguous to ECR zone 48 and others of the particles are guided by some of the magnetic field lines to destinations away from wafer 47. Obviously, the overall tool efficiency with which the surface of wafer 47 is treated by the plasma particles is reduced to the degree that the particles are misdirected. Thus, a plasma source design that alleviates the foregoing power loss and contamination problems would allow for more efficient operation than is available using conventional reactors.

SUMMARY OF THE INVENTION

Accordingly, it is an object of the present invention to provide a plasma generator of the electron cyclotron resonance type having a modified ECR zone subtending an area of magnetic field lines co-extensive with at least a portion of the area of an underlying workpiece.

Another object is to provide a plasma generator of the ECR type for use in a semiconductor device processing tool wherein substantially no magnetic field lines intercept both the ECR zone of the plasma and the tool walls.

A further object is to enhance the efficiency of a plasma processing tool of the ECR type.

These and other objects, as will appear from a reading of the following specification, are achieved in a preferred embodiment of the present invention, by the provision of a cylindrical plasma reaction chamber equipped with at least a pair of axially separated solenoid coils for providing an axially-directed magnetic field and a multipole magnet extending between the solenoid coil pair for providing a transverse cusp field. A working gas is contained within the chamber and is excited by applied microwave energy. The strengths of the two magnetic fields and the microwave frequency value are selected to produce a closed or nearly closed electron cyclotron resonance zone of proper size axially between the solenoid fields and well away from the chamber walls.

Preferably, baffling is used to separate the closed plasma ECR zone from the workpiece region of the chamber. A semiconductor wafer is positioned within the workpiece region to intercept all plasma particles which follow the axially directed magnetic lines passing through the ECR zone. Few of the plasma particles from the closed ECR zone travel to destinations other than the wafer. This result follows from the selection of the values of the two magnetic fields to produce a substantially closed ECR zone, i.e., a closed or nearly closed (except in the direction toward the wafer) ECR zone of a size consistent with the size of the wafer. Thus, the wafer intercepts substantially the entire particle beam flowing along those magnetic lines that penetrate through the substantially closed ECR zone.

In another aspect of the present invention, provision is made for the use of a ring-shaped plasma particle beam source which also is designed in accordance with the foregoing criteria.

BEST MODE FOR CARRYING OUT THE INVENTION

Figure 1:
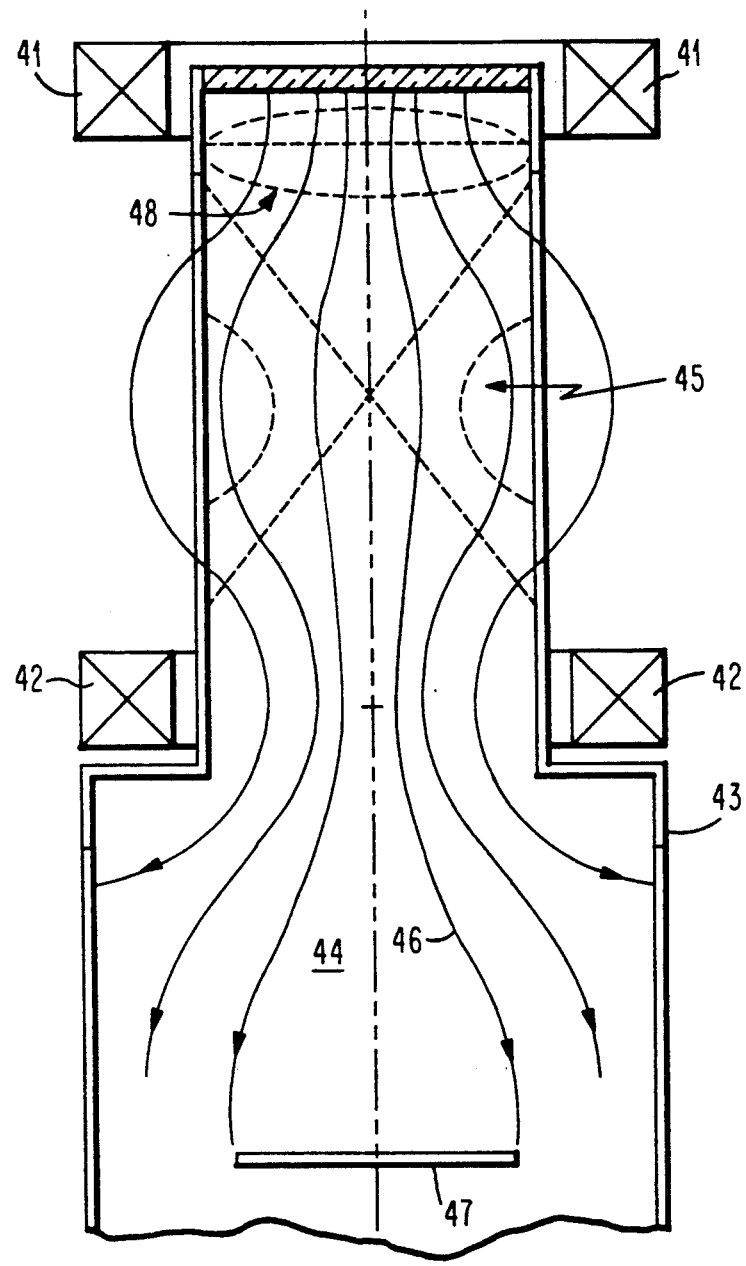
FIG. 1 is a simplified elevational cross-sectional view of a prior art plasma processing tool of the electron cyclotron resonance type and its open ECR magnetic field configuration.
Figure 2:
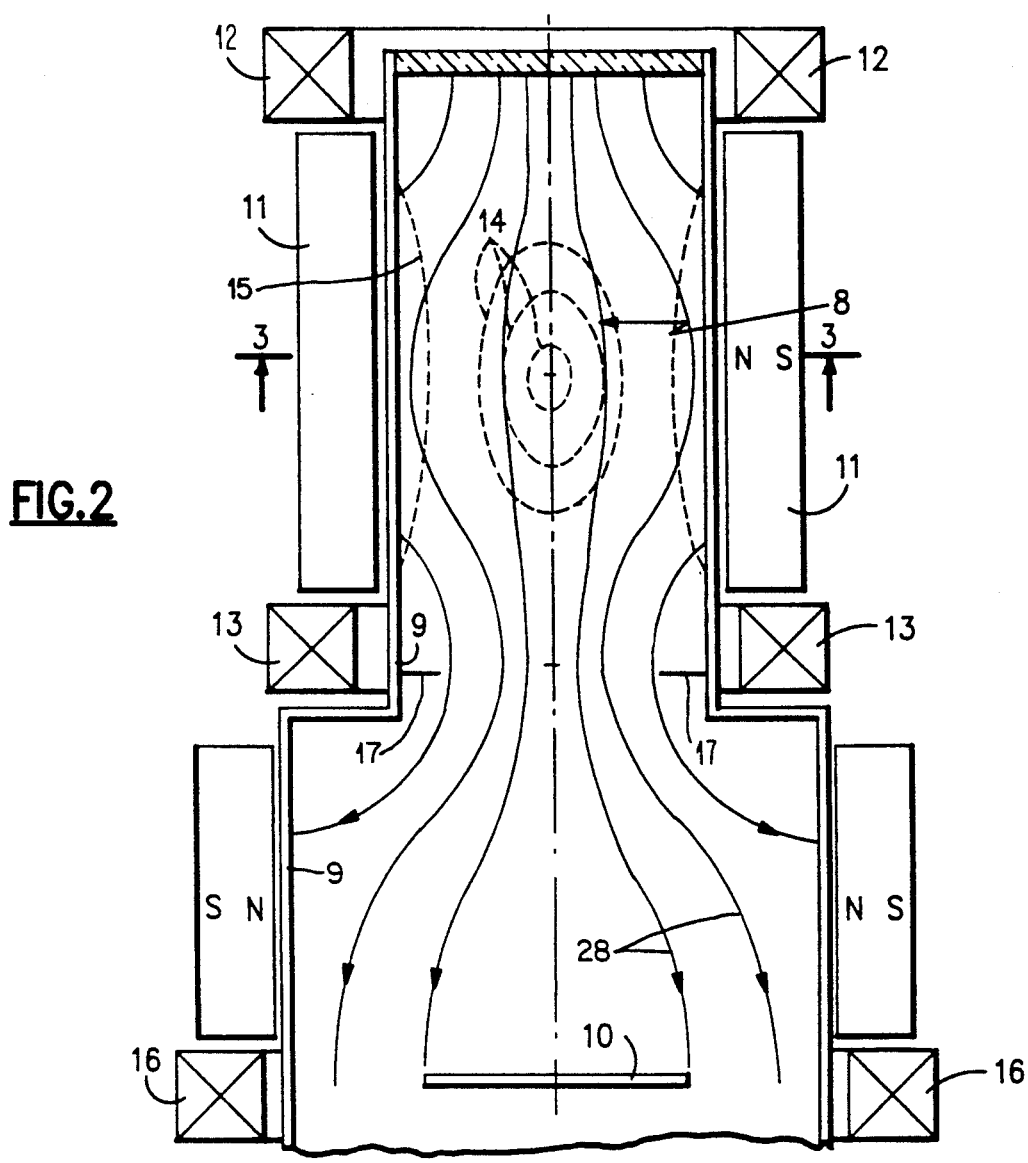
FIG. 2 is a simplified elevational cross-sectional view of one embodiment of the plasma processing tool of the present invention and its closed ECR magnetic field configuration.

In accordance with a first embodiment of the invention, as will be seen by reference to FIG. 2, the ECR zone 8 has been modified relative to the ECR zone 48 of FIG. 1. More particularly, ECR zone 8 is closed in shape and is removed from contact with chamber walls 9. It should be noted that whereas the ECR zone 48 of FIG. 1 crosses all of the magnetic lines 46 (whereby much of the produced plasma particles are not effectively used as already explained), the ECR zone 8 of FIG. 2 has been tailored in size so that only those of the magnetic field lines 28 which are intercepted by wafer target 10 also pass through the ECR zone 8.

The closed ECR zone 8 of FIG. 2 (and the nearly closed ECR zone 8' of FIG. 4) result from the addition of cusp magnets 11, designed to deliver a magnetic field strength which together with the magnetic field strength provided by solenoid coils 12 and 13, produce an ECR zone 8 at the microwave operating frequency of the plasma generator such that all field lines intercepting the work piece 10 also intercept the ECR zone 8, and vice versa. For example, at the conventional microwave operating frequency of 2.45 GHz, the resonance magnetic field value is 875 Gauss. As can be seen in the constant field contours of FIGS. 2 and 4, the innermost contours 14 and 14' including the contour 875 Gauss are completely (or nearly as in the case of FIG. 4) closed plots which do not reach the chamber walls while the outermost contours 15 and 15' are open and reach the chamber walls 9, 9'. As will be appreciated, the shape as well as the scale of the constant field contours are functions of the strengths of the magnetic fields provided by coils 12 and 13 and magnets 11. Such fields are set, in accordance with the present invention so that the ECR zone (in the example given, the zone enclosed by the constant field contour having the value of 875 Gauss) is of a size that subtends an area of some of the magnetic field lines 28, 28' at workpiece 10, which size is co-extensive with the area of the workpiece. When this criterion is met, substantially all of the plasma ions will reach the surface of workpiece 10, 10' and not the chamber walls 9, 9' whereby efficiency is enhanced and the possibility of contamination is reduced due to the reduction of ion bombardment of the chamber walls.

Collimating field coil 16 tends to oppose divergence and to collimate the magnetic field lines 28, 28' at the location of workpiece 10, 10' for a more even distribution of the plasma ions engaging the surface of workpiece 10, 10'. Baffle 17 serves to confine the non-charged hot plasma particles and prevent them from passing out of the plasma generating region between coils 12 and 13 and entering the plasma-workpiece interaction region between coils 13 and 16 for greater process flexibility.

Figure 3:
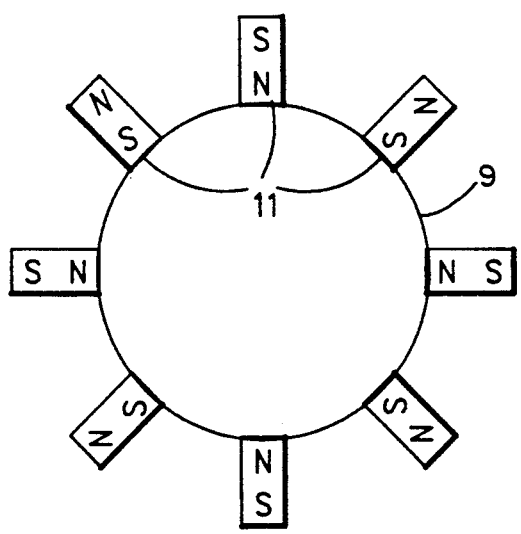
FIG. 3 is a top cross-sectional view of the embodiment of FIG. 2 taken along line 3—3 in FIG. 2.

FIG. 3 shows the annular arrangement of the permanent cusp magnets 11 for generating the multipole cusp magnetic field. Alternatively, the multipole field could be generated by a coil wound about the chamber along a pathway conforming to the pathway of the seam on a baseball as is described in the context of a fusion reactor application in the book Introduction to Plasma Physics by Francis F. Chen, Plenum Press, 1974, pp. 299-300. A baseball coil produces only a quadrupole. Other coils, e.g., Yin-Yang are required for higher order multipoles.

Figure 4:
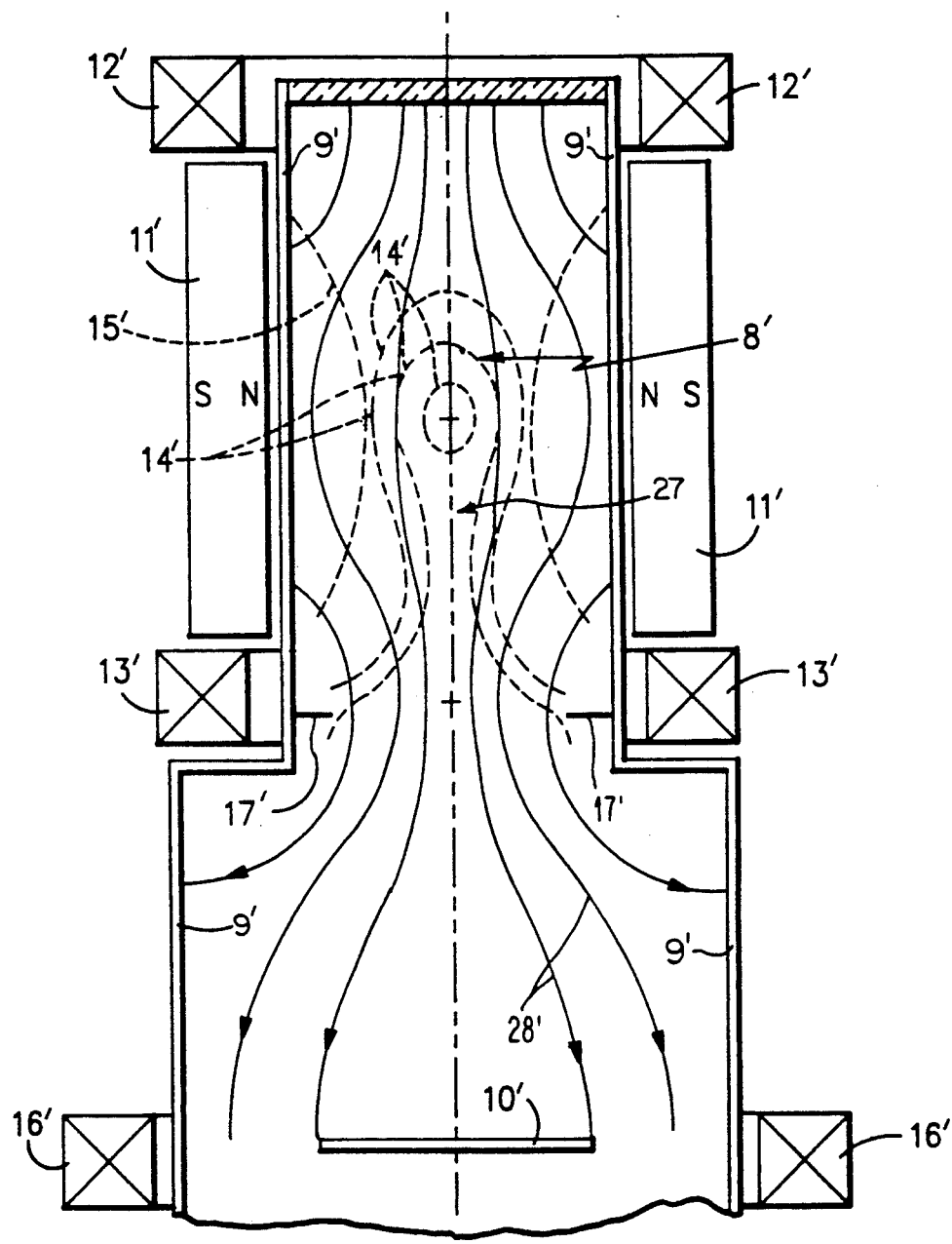
FIG. 4 is a simplified elevational cross-sectional view of a modified embodiment of the plasma processing tool of FIG. 2 and its nearly closed ECR magnetic field configuration.

In the embodiment of the present invention shown in FIG. 4, ECR zone 8' has been modified relative to the ECR zone 8 of FIG. 2. More particularly, although ECR zone 8' (like ECR zone 8 of FIG. 2) is closed in shape in those regions above the plane of coil 13' where substantially all of the coupled microwave energy resides, ECR zone 8' is open (as shown in region 27 of zone 8') in the lowermost region facing workpiece 10' so that there is a reduced magnetic field hurdle to be surmounted by the plasma particles travelling toward workpiece 10'. Most, if not all, of the coupled microwave energy is absorbed in the upper part of ECR zone 8' of FIG. 4 so that little energy, if any, is absorbed in the open part (27) of the ECR zone 8'.

Figure 5:
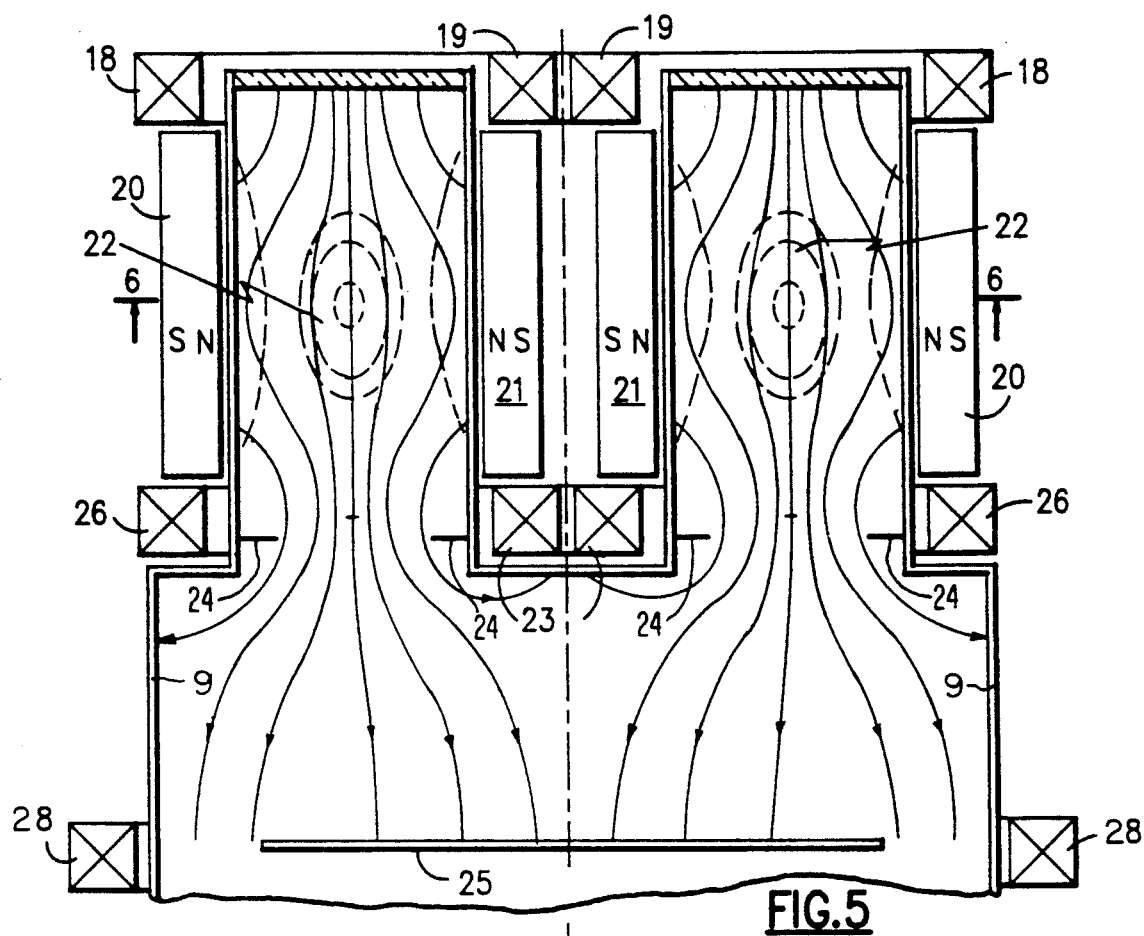
FIG. 5 is a simplified cross-sectional view of a ring-shaped plasma particle beam source embodiment of the present invention.

FIG. 5 shows another embodiment of the present invention providing a ring-shaped plasma particle beam source having the enhanced efficiency and low contamination attributes of the embodiments of FIGS. 2 and 3. Although the ionized plasma particles tend to be guided along the magnetic field lines toward the workpiece in the embodiment of FIGS. 2 and 3, particle diffusion also takes place within the guided beam and reduces the non-uniformity with which the particles irradiate the workpiece surface. In a second aspect of the present invention, uniformity is enhanced by replacing the essentially disc-shaped particle beam of FIGS. 2 and 3 with a ring-shaped particle beam which concentrates the particles about an interior annulus of the workpiece and exploits the unavoidable particle diffusion to spread the irradiation to the interior of the annulus and to the exterior of the annulus adjacent to the peripheral region of the workpiece. Thus, diffusion tends to increase the uniformity of particle irradiation symmetrically in the case of FIG. 5 whereas diffusion tends to decrease such uniformity asymmetrically in the case of FIGS. 2 and 3.

The ring-shaped particle source of FIG. 5 includes an upper pair of different diameter coaxial coils 18 and 19, two configurations of coaxial multipole cusp magnets 20 and 21 and a lower pair of different diameter coaxial coils 23 and 26 whose magnetic field strengths are set to produce toroidal, i.e. ring-shaped, ECR zone 22 at the applied microwave frequency in a manner similar to that described with the aid of FIGS. 2 and 3. As a result of the concentric arrangement of the coils and magnets in FIG. 5, however, an annulus-shaped rather than disk-shaped particle beam is produced. The beam emerges from the ring-apertured baffle 24 and irradiates only an interior annulus of the workpiece 25. As a consequence of particle diffusion, the annular beam is spread to fill in the regions of the workpiece which are interior to as well as exterior to the particle beam annulus for a more even distribution of the beam particles across the surface of the wafer workpiece. Coil 28 is used to shape the magnetic field at the substrate, in a similar manner to coil 16 of FIG. 2.

It should be noted the toroidally shaped ECR zone (22) may be left "open" at the side facing the workpiece, analogously to the situation depicted in FIG. 4. This may be accomplished by lowering the current in bottom coils 23 and 26. This will again, analogously to the situation depicted in FIG. 4, reduce the magnetic mirror the plasma particles must overcome to reach the workpiece 25.

Figure 6:
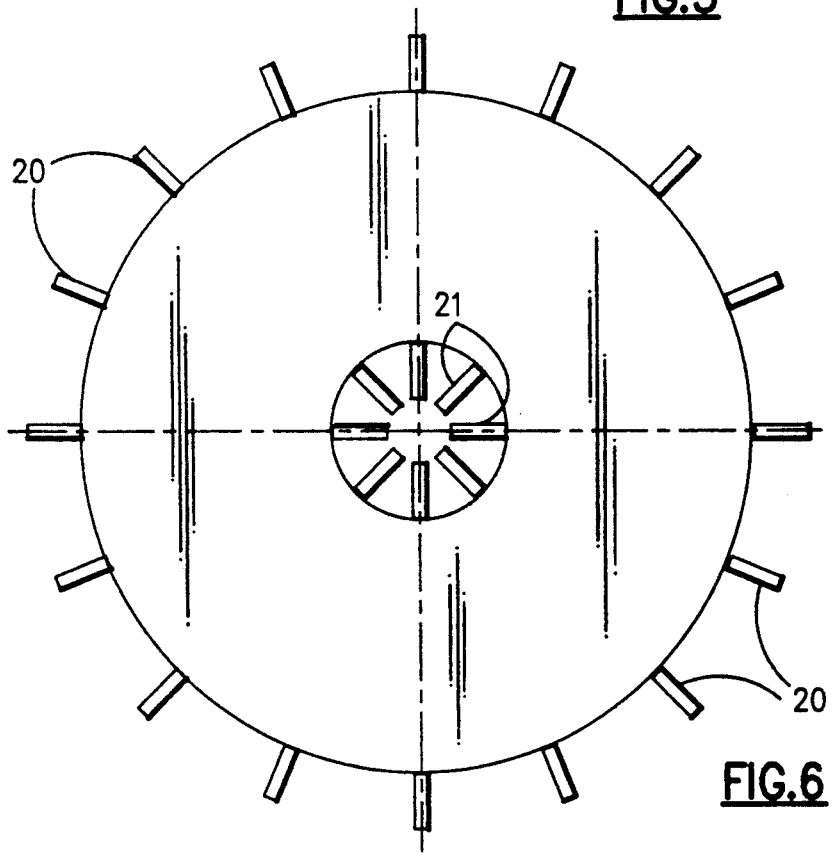
FIG. 6 is a top cross-sectional view of the embodiment of FIG. 5.

FIG. 6 depicts the configuration of the coaxial cusp magnets 20 and 21 for generating the multipole cusp magnetic field.

What is claimed is:

1. A plasma processing tool comprising:
    a) a plasma beam chamber having a plasma beam generating first region and a plasma-workpiece interaction second region extending along an axis of said chamber;
    b) first and second axially separated coil means along said first region for providing a magnetic field directed along the axis of said chamber;
    c) multipole magnet means extending between said oil means for providing a transverse cusp magnetic field;
    d) a gas within said chamber;
    e) means for applying microwave energy to said first region;
    f) said fields having strengths selected to provide with said microwave energy a plasma beam having a substantially closed plasma electron cyclotron resonance zone within said first region;
    g) said zone being removed from contact with the walls of said chamber;
    h) a workpiece in said second region along said axis;
    i) said beam being guided by said magnetic field directed along said axis; and
    j) said zone having a size consistent with a size of said workpiece so that substantially the entirety of said beam is intercepted by said workpiece.

2. A plasma processing tool in accordance with claim 1 wherein said plasma beam aa said workpiece si disc-shaped in cross-section.

3. A plasma processing tool in accordance with claim 1 wherein said plasma beam at said workpiece is ring-shaped in cross-section.

4. A plasma processing tool in accordance with claim 1 and further including apertured baffle means with at least one aperture therethrough positioned between said first and second regions about said axis.

5. A plasma processing tool in accordance with claim 4 wherein said aperture of said baffle means is disc-shaped.

6. A plasma processing tool in accordance with claim 4 wherein said aperture of said baffle is ring-shaped.

7. A plasma processing tool in accordance with claim 1 wherein said multipole magnet means comprise a plurality f permanent magnets.

8. A plasma processing tool in accordance with claim 3 wherein each of said first and second coil means comprises a pair of coaxial coils of different diameter.

9. A plasma processing tool in accordance with claim 3 wherein said multipole magnet means comprises a pair of coaxial multipole cusp magnet means of different diameter.

10. A plasma processing tool in accordance with claim 3 wherein said workpiece is disc-shaped and said ring-shaped beam impinges upon an interior annulus of said workpiece.

11. A plasma processing tool for exposure of a workpiece with a ring-shaped plasma beam comprising:
    a) a cylindrical plasma beam chamber having
        i) a plasma beam generating first region and
        ii) a plasma-workpiece interaction second region extending along an axis of said chamber;
    b) said plasma beam generating first region being adapted for providing a beam having a ring-shaped cross-section,
    c) said workpiece being disc-shaped; and
    d) said beam being guided to be directed along said axis by means for directing said beam to impinge upon an interior annulus of said workpiece, and
    e) said annulus having a size consistent with a size of said workpiece so that substantially the entirety of said beam is intercepted by said workpiece.

* * * * *